US007838070B2

(12) United States Patent
Gupta et al.

(10) Patent No.: US 7,838,070 B2
(45) Date of Patent: Nov. 23, 2010

(54) METHOD OF COATING GAS TURBINE COMPONENTS

(75) Inventors: Bhupendra K. Gupta, Cincinnati, OH (US); Nripendra Nath Das, West Chester, OH (US); David Dye, Cincinnati, OH (US); Robert G. Zimmerman, Jr., Morrow, OH (US)

(73) Assignee: General Electric Company, Schenectady, NY (US)

( * ) Notice: Subject to any disclaimer, the term of this patent is extended or adjusted under 35 U.S.C. 154(b) by 808 days.

(21) Appl. No.: 11/191,286

(22) Filed: Jul. 28, 2005

(65) Prior Publication Data

US 2008/0014348 A1  Jan. 17, 2008

(51) Int. Cl.
   *B05D 7/22* (2006.01)
(52) U.S. Cl. .................. 427/237; 427/239; 427/250; 427/294; 427/295; 427/376.3
(58) Field of Classification Search .................. 427/250, 427/237, 239, 376.3, 294, 295; 428/679
   See application file for complete search history.

(56) References Cited

U.S. PATENT DOCUMENTS

| 4,148,275 | A | * | 4/1979 | Benden et al. ............... 118/715 |
| 5,169,689 | A | | 12/1992 | Thompson et al. |
| 5,236,745 | A | | 8/1993 | Gupta et al. |
| 5,261,963 | A | * | 11/1993 | Basta et al. ................. 118/724 |
| 5,403,669 | A | | 4/1995 | Gupta et al. |
| 5,419,971 | A | | 5/1995 | Skelly et al. |
| 5,462,013 | A | * | 10/1995 | Punola et al. ................ 118/719 |
| 5,780,106 | A | * | 7/1998 | Conner ......................... 427/250 |
| 5,817,371 | A | | 10/1998 | Gupta et al. |
| 6,020,075 | A | | 2/2000 | Gupta et al. |
| 6,168,874 | B1 | | 1/2001 | Gupta et al. |
| 6,440,496 | B1 | | 8/2002 | Gupta et al. |
| 6,465,040 | B2 | | 10/2002 | Gupta et al. |
| 6,495,271 | B1 | * | 12/2002 | Vakil ........................... 428/632 |
| 6,503,574 | B1 | | 1/2003 | Skelly et al. |
| 6,555,179 | B1 | | 4/2003 | Reeves et al. |
| 6,800,376 | B1 | | 10/2004 | Gupta et al. |
| 2002/0090527 | A1 | * | 7/2002 | Thompson et al. ........... 428/553 |
| 2002/0187327 | A1 | * | 12/2002 | Nagaraj et al. ............... 428/220 |
| 2004/0005410 | A1 | * | 1/2004 | Seidel ..................... 427/255.28 |
| 2004/0081767 | A1 | * | 4/2004 | Pfaendtner et al. ........... 427/402 |
| 2004/0180232 | A1 | * | 9/2004 | Das et al. ..................... 428/610 |

OTHER PUBLICATIONS

Warnes, Bruce, "Cool Coatings Let Engines Run Hotter". Machine Design, Dec. 22, 2002.*
Merriam-Webster's Collegiate Dictionary, 10th edition, p. 266.*

* cited by examiner

*Primary Examiner*—Bret Chen
(74) *Attorney, Agent, or Firm*—William Scott Andes, Esq.; Armstrong Teasdale LLP

(57) ABSTRACT

A method of forming a metal coating on surfaces of internal passages of a turbine blade includes, in an exemplary embodiment, the steps of positioning the turbine blade in a CVD chamber, coupling a reagent gas manifold to at least one internal passage inlet, and coating the surfaces of the at least one internal passage by a CVD process using metal coating reagent gases to form a metal coating on the surfaces of the at least one internal passage.

19 Claims, 6 Drawing Sheets

METHOD OF COATING GAS TURBINE COMPONENTS

BACKGROUND OF THE INVENTION

This invention relates generally to gas turbine engines, and more particularly, to methods of depositing protective coatings on components of gas turbine engines.

Gas turbine engines typically include high and low pressure compressors, a combustor, and at least one turbine. The compressors compress air which is mixed with fuel and channeled to the combustor. The mixture is then ignited for generating hot combustion gases, and the combustion gases are channeled to the turbine which extracts energy from the combustion gases for powering the compressor, as well as producing useful work to propel an aircraft in flight or to power a load, such as an electrical generator.

The operating environment within a gas turbine engine is both thermally and chemically hostile. Significant advances in high temperature alloys have been achieved through the formulation of iron, nickel and cobalt-base superalloys, though components formed from such alloys often cannot withstand long service exposures if located in certain sections of a gas turbine engine, such as the turbine, combustor and augmentor. A common solution is to provide turbine, combustor and augmentor components with an environmental coating that inhibits oxidation and hot corrosion, or a thermal barrier coating (TBC) system that, in addition to inhibiting oxidation and hot corrosion, also thermally insulates the component surface from its operating environment.

Coating materials that have found wide use as environmental coatings include diffusion aluminide coatings, which are generally single-layer oxidation-resistant layers formed by a diffusion process, such as pack cementation. Diffusion processes generally entail reacting the surface of a component with an aluminum-containing gas composition to form two distinct zones, the outermost of which is an additive layer containing an environmentally-resistant intermetallic represented by MAl, where M is iron, nickel or cobalt, depending on the substrate material. Beneath the additive layer is a diffusion zone that includes various intermetallic and metastable phases that form during the coating reaction as a result of diffusion gradients and changes in elemental solubility in the local region of the substrate. During high temperature exposure in air, the MAl intermetallic forms a protective aluminum oxide (alumina) scale or layer that inhibits oxidation of the diffusion coating and the underlying substrate.

High reliability TBC bond coats consisting of a NiAl overlay coating is highly sensitive to aluminide processing. Aluminide before and /or after the NiAl coating can result in substantial degradation of the TBC cyclic life. However, in order to protect the inside cooling passages from oxidation and hot corrosion, a vapor phase aluminide is required. This cross-functional requirement between external and internal surfaces of a turbine blade forces a highly labor intensive and costly process of vapor phase aluminiding (VPA) coating, chemical stripping of aluminide from external and protecting the internal passages while chemical processing. Additionally, these steps add the risk of chemically attacking the coating deposited on the internal passages.

Known process technology consists of VPA coating, at about 1800° F. to about 2000° F., the entire blade including both internal and external surfaces, filling inside passages with wax to protect from chemical attack, striping Al from the external surfaces by chemical surface treatment, removing the wax, and heat tint to assure that all aluminide is removed. These process steps can add a cost penalty and about 7-10 days of added manufacturing time.

BRIEF DESCRIPTION OF THE INVENTION

In one aspect, a method of forming a metal coating on surfaces of internal passages of a turbine blade is provided. The turbine blade includes an outer surface and at least one internal passage. The method includes the steps of positioning the turbine blade in a CVD chamber, coupling a reagent gas manifold to at least one internal passage inlet, and coating the surfaces of the at least one internal passage by a CVD process using metal coating reagent gases to form a metal coating on the surfaces of the at least one internal passage.

In another aspect, a method of forming a metal coating on surfaces of internal passages of a turbine blade is provided The turbine blade includes an outer surface and at least one internal passage. The method includes the steps of positioning the turbine blade in a CVD chamber, coupling a reagent gas manifold to at least one internal passage inlet, evacuating the CVD chamber to form a vacuum in the CVD chamber, pumping organic-metal reagent gasses through the manifold and into the at least one internal passage to form a metal coating on the surfaces of the at least one internal passage, and evacuating the organic-metal reagent gasses from the CVD chamber.

DETAILED DESCRIPTION OF THE INVENTION

A method of coating the internal passages of a turbine rotor blade with a metal coating is described below in detail. The method includes coating the internal cooling passages utilizing a CVD process to deposit a diffusion aluminide coating on the interior surfaces to protect the internal serpentine cooling passage from oxidation and hot corrosion. The process operates at lower temperatures than known coating process, and encompasses fewer steps than known coating process, thereby, lowering production time and manufacturing costs.

Figure 1:
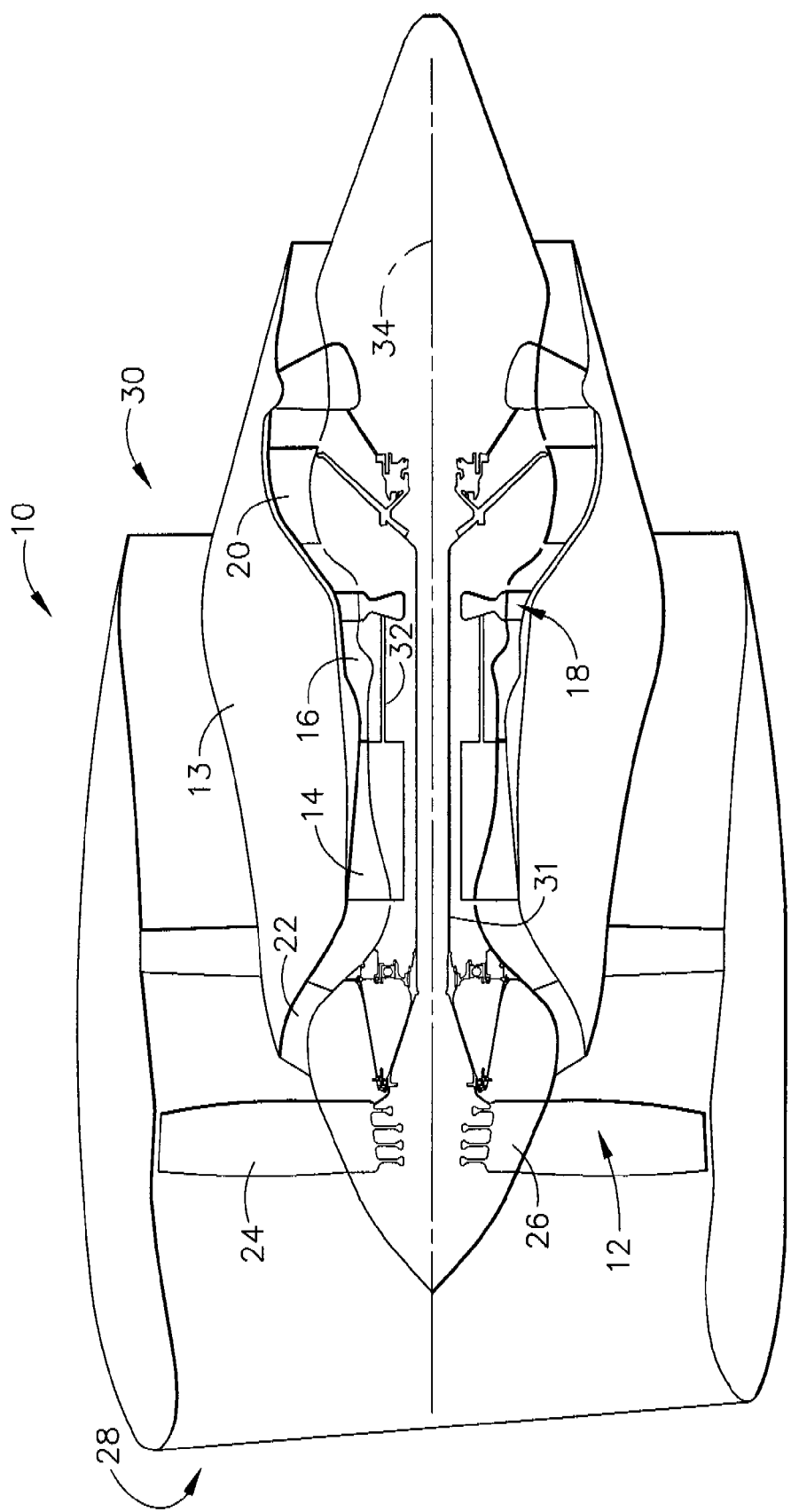
FIG. 1 is schematic illustration of a gas turbine engine.

Referring to the drawings, FIG. 1 is a schematic illustration of a gas turbine engine 10 that includes a fan assembly 12 and a core engine 13 including a high pressure compressor 14, and a combustor 16. Engine 10 also includes a high pressure turbine 18, a low pressure turbine 20, and a booster 22. Fan assembly 12 includes an array of fan blades 24 extending radially outward from a rotor disc 26. Engine 10 has an intake side 28 and an exhaust side 30. In one embodiment, the gas turbine engine is a GE90 available from General Electric Company, Cincinnati, Ohio. Fan assembly 12 and turbine 20 are coupled by a first rotor shaft 31, and compressor 14 and turbine 18 are coupled by a second rotor shaft 32.

During operation, air flows through fan assembly 12, along a central axis 34, and compressed air is supplied to high pressure compressor 14. The highly compressed air is delivered to combustor 16. Airflow (not shown in FIG. 1) from combustor 16 drives turbines 18 and 20, and turbine 20 drives fan assembly 12 by way of shaft 31.

Figure 2:
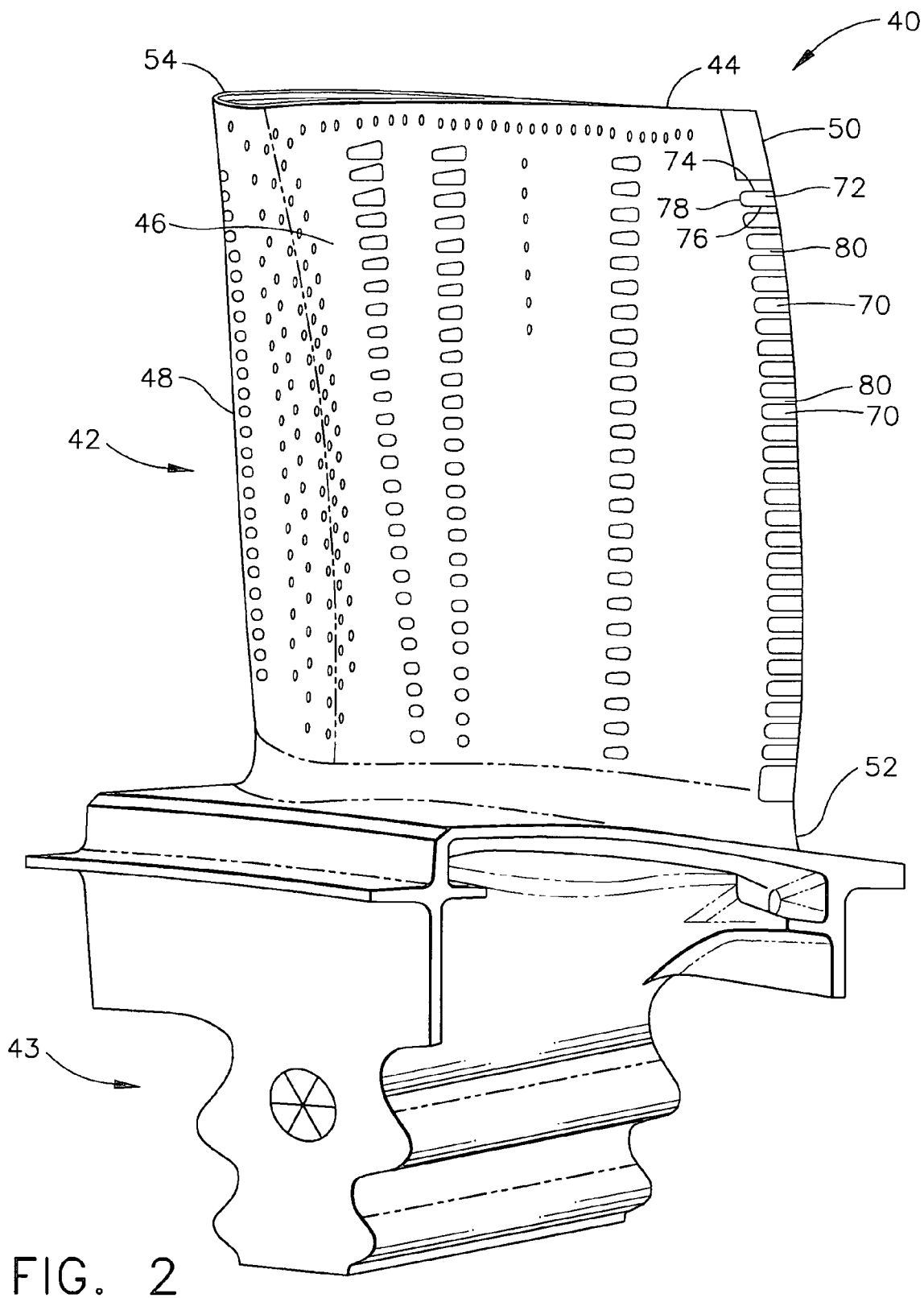
FIG. 2 is a perspective schematic illustration of a turbine rotor blade shown in FIG. 1.
Figure 3:
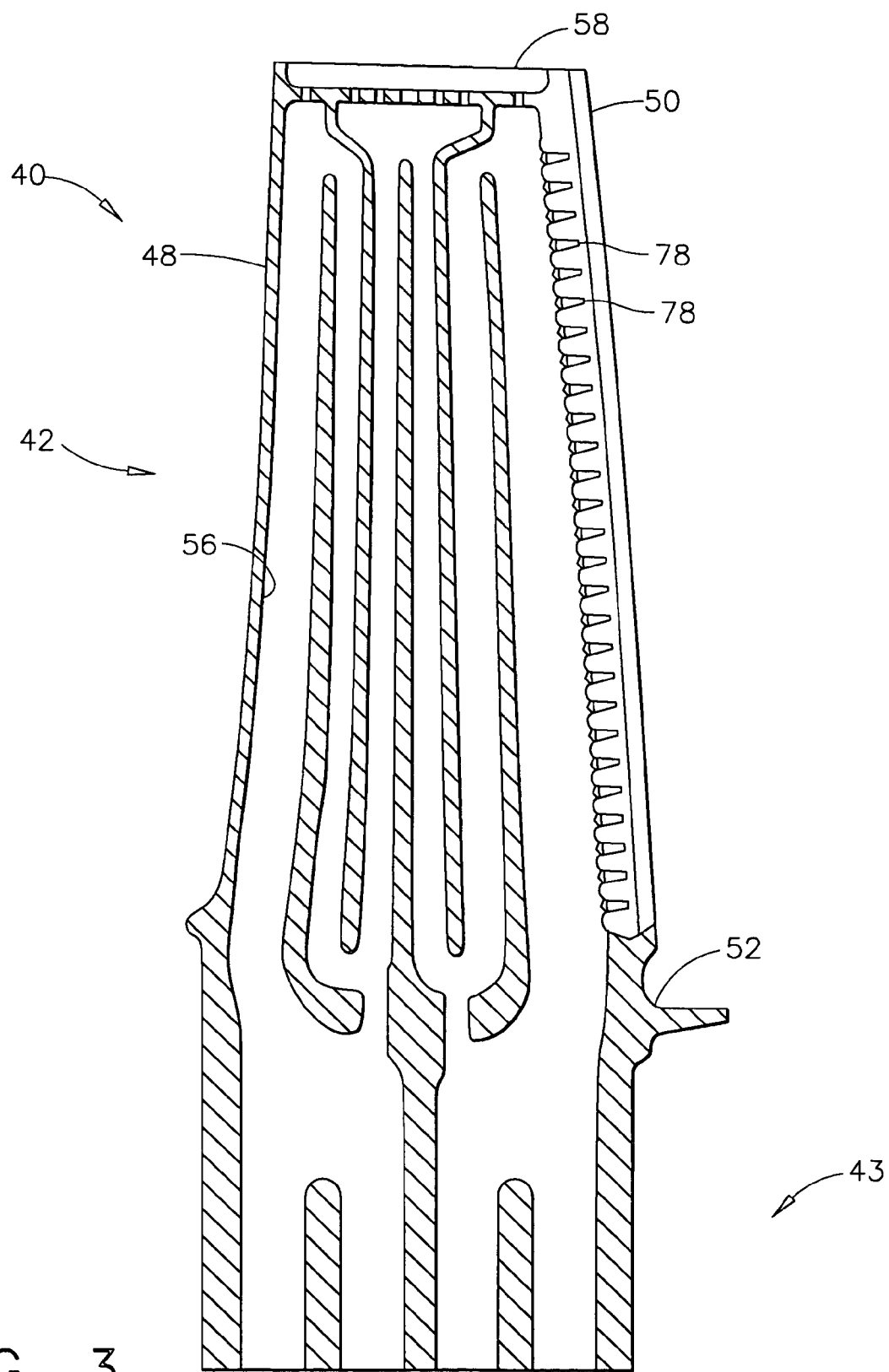
FIG. 3 is an internal schematic illustration of the turbine rotor blade shown in FIG. 2.

FIG. 2 is a perspective schematic illustration of a turbine rotor blade 40 that may be used with gas turbine engine 20 (shown in FIG. 1). FIG. 3 is an internal schematic illustration of turbine rotor blade 40. Referring to FIGS. 2 and 3, in an exemplary embodiment, a plurality of turbine rotor blades 40 form a high pressure turbine rotor blade stage (not shown) of gas turbine engine 20. Each rotor blade 40 includes a hollow airfoil 42 and an integral dovetail 43 used for mounting airfoil 42 to a rotor disk (not shown) in a known manner.

Airfoil 42 includes a first sidewall 44 and a second sidewall 46. First sidewall 44 is convex and defines a suction side of airfoil 42, and second sidewall 46 is concave and defines a pressure side of airfoil 42. Sidewalls 44 and 46 are connected at a leading edge 48 and at an axially-spaced trailing edge 50 of airfoil 42 that is downstream from leading edge 48.

First and second sidewalls 44 and 46, respectively, extend longitudinally or radially outward to span from a blade root 52 positioned adjacent dovetail 43 to a tip plate 54 which defines a radially outer boundary of an internal cooling chamber 56. Cooling chamber 56 is defined within airfoil 42 between sidewalls 44 and 46. Internal cooling of airfoils 42 is known in the art. In the exemplary embodiment, cooling chamber 56 includes a serpentine passage 58 cooled with compressor bleed air.

Cooling cavity 56 is in flow communication with a plurality of trailing edge slots 70 which extend longitudinally (axially) along trailing edge 50. Particularly, trailing edge slots 70 extend along pressure side wall 46 to trailing edge 50. Each trailing edge slot 70 includes a recessed wall 72 separated from pressure side wall 46 by a first sidewall 74 and a second sidewall 76. A cooling cavity exit opening 78 extends from cooling cavity 56 to each trailing edge slot 70 adjacent recessed wall 72. Each recessed wall 72 extends from trailing edge 50 to cooling cavity exit opening 78. A plurality of lands 80 separate each trailing edge slot 70 from an adjacent trailing edge slot 70. Sidewalls 74 and 76 extend from lands 80.

Figure 4:
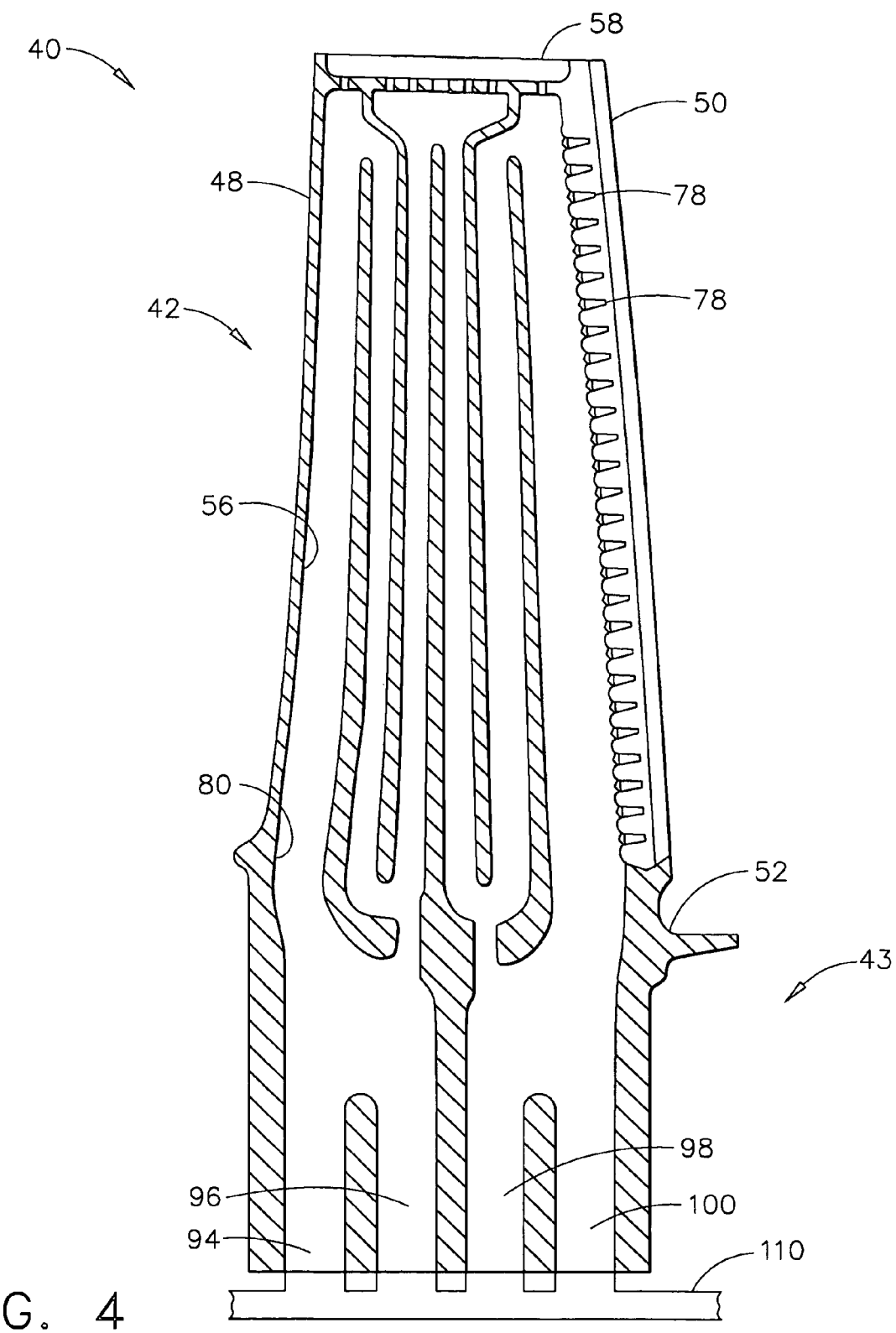
FIG. 4 is an internal schematic illustration of the turbine rotor blade shown in FIG. 2 coupled to a CVD manifold.
Figure 5:
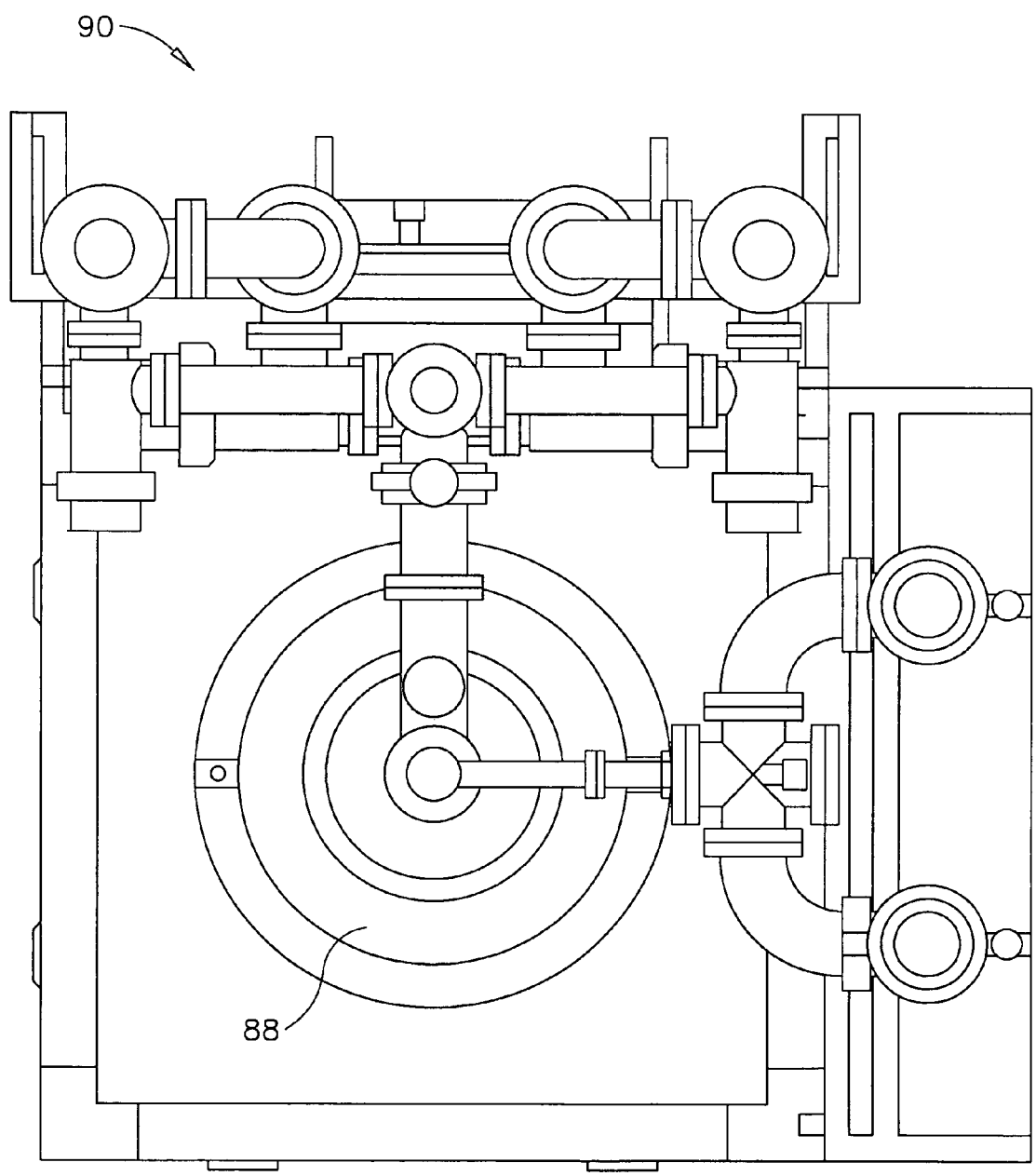
FIG. 5 is a schematic illustration of a CVD system.
Figure 6:
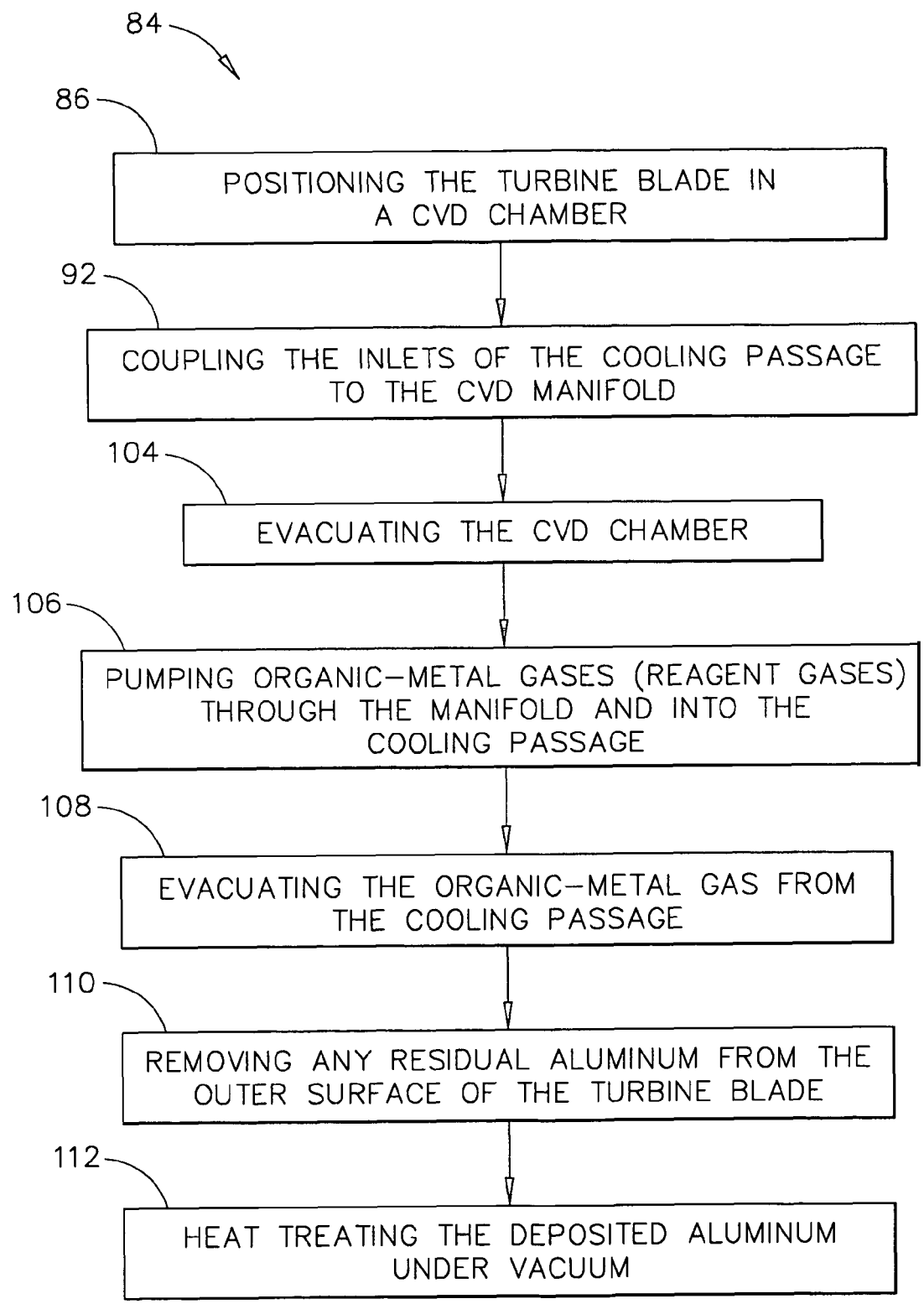
FIG. 6 is a flow diagram of a method of coating the internal passages of the turbine rotor blade shown in FIG. 2.

Referring also to FIGS. 4, 5, and 6, in the exemplary embodiment, to protect internal serpentine cooling passage 58 from oxidation and hot corrosion, internal cooling passage 58 is coated by a CVD process 84 to deposit a diffusion aluminide coating on interior surface 82 of internal cooling passage 58. CVD process 84 includes positioning 86 turbine blade 40 in a CVD chamber 88 of a CVD coating system 90 and coupling 92 inlets 94, 96, 98, and 100 of cooling passage 58 to a CVD manifold 102 configured to supply metal reagent gases, for example, organic-metal gases. CVD process 84 also includes evacuating 104 CVD chamber 88 to provide a vacuum, and pumping 106 organic-metal gases (reagent gases), at about 200° F. to about 1000° F., through manifold 102 and into cooling passage 58 through inlets 94, 96, 98, and 100 to deposit a metallic coating onto internal surface of cooling passage 58. In an alternate embodiment, the organic gases are at about 200° F. to about 800° F. Any suitable organic-metal material can be used in the above described process, for example, an organic-aluminum material, an organic-chromium material, an organic-cobalt material, and mixtures thereof. In one exemplary embodiment, triethyl aluminum is used, in alternate embodiments aluminum alkyls, for example, triisobutylaluminum, trimethylaluminum, and dimethylaluminum hydride, and alane complexes, for example, dimethylethylamine alane and trimethylamine alane can be used.

CVD process 84 further includes evacuating 108 the triethyl aluminum gas from cooling passage 58 after depositing an aluminum coating from the triethyl aluminum gas onto interior surface 82 of cooling passage 58, and removing 110 any residual aluminum that was deposited on the outer surface of turbine blade 40. This can sometime occur around cooling slots 78. In an alternate embodiment, the outer surface of turbine blade 40 is masked to prevent unwanted deposits of aluminum. CVD process 84 also includes heat treating 112 the deposited aluminum under vacuum at about 1800° F. to about 2000° F. for about 2 hours to about 10 hours, and in another embodiment, from about 4 hours to about 8 hours.

The above described process 84 provides for coating the interior surfaces of turbine blade 40 with a metal coating to protect the interior surfaces from corrosion and/or oxidation while preventing a build-up of metal coating on the exterior surfaces of turbine blade 40. Process 84 operates at lower temperatures than known coating process. Also, process 84 encompasses fewer steps than known coating process, thereby lowering production time and manufacturing costs.

While the invention has been described in terms of various specific embodiments, those skilled in the art will recognize that the invention can be practiced with modification within the spirit and scope of the claims.

What is claimed is:

1. A method of forming a metal coating on surfaces of internal passages of a turbine blade, the turbine blade having an outer surface and comprising at least one internal passage, said method comprising:
    positioning the turbine blade in a CVD chamber;
    coupling a reagent gas manifold to at least one internal passage inlet;
    coating the surfaces of the at least one internal passage by a CVD process using metal coating reagent gases to form a metal coating on the surfaces of the at least one internal passage; and
    evacuating residual metal coating reagent gases from the at least one internal passage via at least one exit opening that extends through the outer surface from the at least one internal passage.

2. A method in accordance with claim 1 wherein the metal coating reagent gases comprise at least one of an aluminum reagent gas, a chromium reagent gas, and a cobalt reagent gas.

3. A method in accordance with claim 1 further comprising vacuum heat treating the metal coating at about 1800° F. to about 2000° F. for about 2 hours to about 10 hours.

4. A method in accordance with claim 1 further comprising masking the outer surface of the turbine blade to prevent metal deposits.

5. A method in accordance with claim 1 further comprising removing residual metal coating from the outer surface of the turbine blade.

6. A method in accordance with claim 5 wherein removing residual metal comprises at least one of brushing the outer surface of the turbine blade and vapor hone blasting the outer surface of the turbine blade.

7. A method in accordance with claim 1 wherein the metal reagent comprises a organic metal material.

8. A method in accordance with claim 7 wherein the organic metal material comprises at least one of triethyl aluminum, triisobutylaluminum, trimethylaluminum, dimethylaluminum hydride, dimethylethylamine alane and trimethylamine alane.

9. A method in accordance with claim 1 wherein coating the surfaces of the at least one internal passage by a CVD process comprises coating the surfaces of the at least one internal passage by a CVD process at a temperature of about 200° F. to about 1000° F.

10. A method in accordance with claim 1 wherein coating the surfaces of the at least one internal passage by a CVD process comprises coating the surfaces of the at least one internal passage by a CVD process at a temperature of about 200° F. to about 800° F.

11. A method of forming a metal coating on surfaces of internal passages of a turbine blade, the turbine blade having an outer surface and comprising at least one internal passage, said method comprising:
   positioning the turbine blade in a CVD chamber;
   coupling a reagent gas manifold to at least one internal passage inlet;
   evacuating the CVD chamber to form a vacuum in the CVD chamber;
   pumping organic-metal reagent gasses through the manifold and into the at least one internal passage to form a metal coating on the surfaces of the at least one internal passage;
   evacuating residual metal coating reagent gases from the at least one internal passage via at least one exit opening that extends through the outer surface from the at least one internal passage; and
   evacuating the organic-metal reagent gasses from the CVD chamber.

12. A method in accordance with claim 11 wherein the metal coating reagent gases comprise at least one of an aluminum reagent gas, a chromium reagent gas, and a cobalt reagent gas.

13. A method in accordance with claim 11 further comprising vacuum heat treating the metal coating at about 1800° F. to about 2000° F. for about 2 hours to about 10 hours.

14. A method in accordance with claim 11 further comprising masking the outer surface of the turbine blade to prevent metal deposits.

15. A method in accordance with claim 11 further comprising removing residual metal coating from the outer surface of the turbine blade.

16. A method in accordance with claim 15 wherein removing residual metal comprises at least one of brushing the outer surface of the turbine blade and vapor hone blasting the outer surface of the turbine blade.

17. A method in accordance with claim 11 wherein the metal reagent comprises a organic metal material comprising at least one of triethyl aluminum, triisobutylaluminum, trimethylaluminum, dimethylaluminum hydride, dimethylethylamine alane and trimethylamine alane.

18. A method in accordance with claim 11 wherein coating the surfaces of the at least one internal passage by a CVD process comprises coating the surfaces of the at least one internal passage by a CVD process at a temperature of about 200° F. to about 1000° F.

19. A method in accordance with claim 11 wherein coating the surfaces of the at least one internal passage by a CVD process comprises coating the surfaces of the at least one internal passage by a CVD process at a temperature of about 200° F. to about 800° F.

* * * * *